(12) United States Patent
Moore et al.

(10) Patent No.: US 12,230,994 B2
(45) Date of Patent: Feb. 18, 2025

(54) PULSE CHARGING OF A CAPACITOR

(71) Applicant: BAE SYSTEMS plc, London (GB)

(72) Inventors: Ian Anthony Moore, Chelmsford (GB); Michael James Parker, Chelmsford (GB); Daniel James Scott, Chelmsford (GB); Stuart James Toms, Chelmsford (GB)

(73) Assignee: BAE SYSTEMS PLC, London (GB)

( * ) Notice: Subject to any disclaimer, the term of this patent is extended or adjusted under 35 U.S.C. 154(b) by 585 days.

(21) Appl. No.: 17/596,220

(22) PCT Filed: Jun. 4, 2020

(86) PCT No.: PCT/GB2020/051351
§ 371 (c)(1),
(2) Date: Dec. 6, 2021

(87) PCT Pub. No.: WO2020/249929
PCT Pub. Date: Dec. 17, 2020

(65) Prior Publication Data
US 2022/0302742 A1   Sep. 22, 2022

(30) Foreign Application Priority Data
Jun. 13, 2019   (GB) ...................................... 1908770

(51) Int. Cl.
*H02J 7/00*   (2006.01)
*H01F 27/28*   (2006.01)
(Continued)

(52) U.S. Cl.
CPC .......... *H02J 7/345* (2013.01); *H01F 27/2895* (2013.01); *H01F 38/00* (2013.01);
(Continued)

(58) Field of Classification Search
CPC .... H02J 7/345; H02J 7/00711; H02J 2207/50; H01F 27/2895; H01F 38/00; H01F 30/00; H03K 3/53
(Continued)

(56) References Cited

U.S. PATENT DOCUMENTS

| | | |
|---|---|---|
| 3,735,195 A | 5/1973 | Jenkins et al. |
| 5,754,579 A | 5/1998 | Mizoguchi et al. |
| 2008/0238211 A1* | 10/2008 | Yampolsky .............. H03K 3/57 307/108 |

FOREIGN PATENT DOCUMENTS

| | | |
|---|---|---|
| JP | H03124273 A | 5/1991 |
| JP | H07111441 A | 4/1995 |

(Continued)

OTHER PUBLICATIONS

J.-q. Xin, M.-j. Li and Q. Kang, "A high ratio air-core pulse transformer," 2008 17th International Conference on High Power Particle Beams (BEAMS), Xi'an, China, 2008, pp. 1-4. (Year: 2008).*

(Continued)

*Primary Examiner* — Zixuan Zhou
(74) *Attorney, Agent, or Firm* — Finch & Maloney PLLC

(57) ABSTRACT

There is provided an apparatus for pulse charging of a load capacitor, the apparatus comprising: a ferrous cored transformer having a primary winding and a secondary winding; a primary circuit connected to the primary winding; a secondary circuit connected to the secondary winding, the secondary circuit comprising the load capacitor; and an uncoupled inductance in the primary circuit or the secondary (Continued)

circuit, the uncoupled inductance reducing the coupling coefficient between the primary circuit and the secondary circuit.

11 Claims, 9 Drawing Sheets

(51) Int. Cl.
  *H01F 38/00* (2006.01)
  *H02J 7/34* (2006.01)
  *H03K 3/53* (2006.01)
  *H01F 30/00* (2006.01)

(52) U.S. Cl.
  CPC ............ *H02J 7/00711* (2020.01); *H03K 3/53* (2013.01); *H01F 30/00* (2013.01); *H02J 2207/50* (2020.01)

(58) Field of Classification Search
  USPC ........................................................ 320/166
  See application file for complete search history.

(56) References Cited

FOREIGN PATENT DOCUMENTS

| | | |
|---|---|---|
| JP | H118987 A | 1/1999 |
| JP | 2010200446 A | 9/2010 |
| WO | 8503980 A1 | 9/1985 |
| WO | 9513470 A1 | 5/1995 |
| WO | 2020249929 A1 | 12/2020 |

OTHER PUBLICATIONS

International Search Report and Written Opinion received for PCT Application No. PCT/GB2020/051351. Mail date: Jul. 28, 2020. 13 pages.
GB Search Report under Section 17(5) received for GB Application No. 1908770.9, dated Dec. 9, 2019. 4 pages.
Xin, et al., "A high ratio air-core pulse transformer," High Power Particle Beams (Beams), IEEE, Jul. 6, 2008. 4 pages.
International Preliminary Report on Patentability received for PCT Application No. PCT/GB2020/051351. Mail date: Dec. 23, 2021. 8 pages.

* cited by examiner

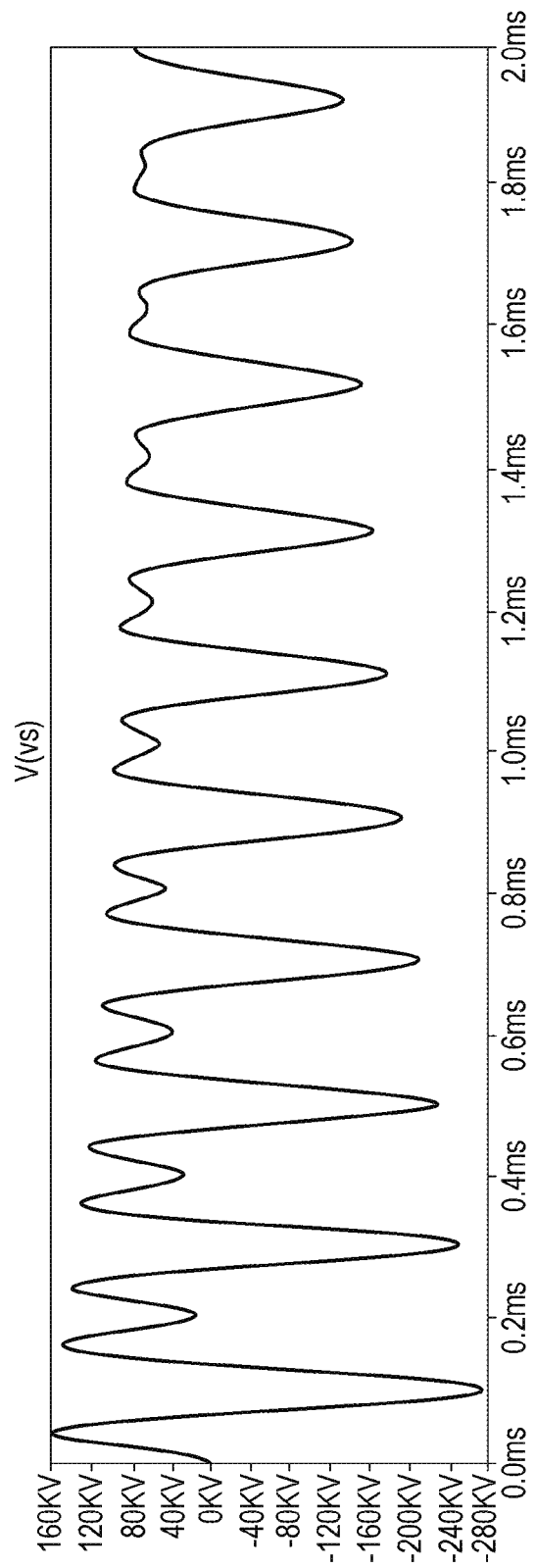

PULSE CHARGING OF A CAPACITOR

FIELD OF INVENTION

The present invention relates to an apparatus for pulse charging of a load capacitor, a method of pulse charging a load capacitor, and a method of designing a circuit for pulse charging a load capacitor.

BACKGROUND

It is known that a transformer circuit may be resonantly tuned to facilitate high efficiency pulse charging of a capacitor.

All transformers are resonant to some extent since the transformer windings or coils have capacitance as well as inductance. The present application relates to dual resonant transformers, a popular example of which is the Tesla transformer, sometimes referred to as a "Tesla Coil".

A common feature of dual resonant Tesla transformers is that additional capacitance is added on both sides of the transformer to tune respective primary and secondary circuits to the same resonant frequency.

A Tesla Coil is an example of a dual resonant transformer designed with a coupling coefficient (also referred to as a k-factor) between the primary and secondary windings of less than 0.1. This means that the respective primary and secondary circuits are loosely coupled and that the secondary voltage achieves resonance over 5-10 cycles from initial conditions. The exact value of the coupling coefficient is not critical in such instances.

In a capacitor charging application it is desirable to charge the secondary capacitance in as few cycles as possible, as this maximises efficiency. It can be shown that certain discrete values of coupling coefficient allow for substantially complete energy transfer on the second, third, or $N^{th}$ voltage peak. It has been found that a coupling coefficient of 0.6 gives substantially complete energy transfer on the second voltage peak, and this is most suited to capacitor charging.

Conventional air-cored Tesla Coils use precise geometric construction to achieve the desired coupling coefficient between the primary and secondary windings or coils. The corresponding primary and secondary circuits are then designed to minimise any additional inductance. The primary winding typically comprises a single turn and is driven from a high voltage capacitor discharged in the primary circuit by a spark gap. Such air-cored Tesla Coils require a driver circuit that is capable of delivering high primary voltage and high peak currents, and minimal inductance.

SUMMARY OF INVENTION

There is provided an apparatus for pulse charging of a load capacitor, the apparatus comprising: a ferrous cored transformer having a primary winding and a secondary winding; a primary circuit connected to the primary winding; a secondary circuit connected to the secondary winding, the secondary circuit comprising the load capacitor; and an uncoupled inductance in the primary circuit or the secondary circuit, the uncoupled inductance reducing the coupling coefficient between the primary circuit and the secondary circuit.

The use of a ferrous cored transformer with a coupling coefficient greater than 0.6 allows a lower primary voltage to be used, and requires lower peak currents. Accordingly, a capacitor charging apparatus according to the present application can be powered by a semi-conductor based driver. This reduces system complexity, volume, and cost.

The uncoupled inductance is an inductor that is electrically connected to either the primary or secondary winding of the transformer. The uncoupled inductance may be a tuning inductor. The uncoupled inductance is not magnetically coupled to the transformer windings. The uncoupled inductance may have a coupling coefficient with the primary winding of around zero. The uncoupled inductance may have a coupling coefficient with the secondary winding of around zero.

The ferrous cored transformer may be a ferrite cored transformer.

The uncoupled inductance may be in series with the primary winding or the secondary winding.

The coupling coefficient between the primary circuit and the secondary circuit may be such that the load capacitor charges on the second voltage peak. In an alternative arrangement the coupling coefficient between the primary circuit and the secondary circuit may be such that the load capacitor charges on the third voltage peak. In an alternative arrangement the coupling coefficient between the primary circuit and the secondary circuit may be such that the load capacitor charges on the fourth voltage peak. In an alternative arrangement the coupling coefficient between the primary circuit and the secondary circuit may be such that the load capacitor charges on the $N^{th}$ voltage peak.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

The uncoupled inductance may be provided by a variable inductor component.

There is further provided a method of pulse charging of a load capacitor, the method comprising: connecting a primary circuit to a primary winding of a ferrous cored transformer; connecting a secondary circuit to a secondary winding of a ferrous cored transformer, the secondary circuit comprising the load capacitor; and connecting an uncoupled inductance in the primary circuit or the secondary circuit, the uncoupled inductance reducing the coupling coefficient between the primary circuit and the secondary circuit.

The ferrous cored transformer may be a ferrite cored transformer.

The uncoupled inductance may be in series with the primary winding or the secondary winding.

The coupling coefficient between the primary circuit and the secondary circuit may be such that the load capacitor charges on the second voltage peak, or the $N^{th}$ voltage peak.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

The uncoupled inductance may be provided by a variable inductor component.

There is further provided a method of designing a circuit for pulse charging of a load capacitor, the method comprising: selecting a ferrous cored transformer, and calculating the mutual inductance between the primary and secondary windings; determining the secondary circuit resonant frequency; and identifying a required coupling coefficient for the primary and secondary circuits, and calculating a required value of an uncoupled primary inductance such that the primary and secondary circuits are coupled by the required coupling coefficient.

Calculating the mutual inductance between the primary and secondary windings may comprise identifying the primary winding inductance, the secondary winding inductance, the coupling coefficient between the primary and secondary windings, and calculating therefrom the mutual inductance between the primary and secondary windings.

Determining the secondary circuit resonant frequency may comprise determining the secondary winding capacitance, secondary winding inductance, and load capacitance, and calculating therefrom the secondary circuit resonant frequency.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

BRIEF DESCRIPTION OF FIGURES

FIG. 13 is a graph showing the voltage at the load capacitor, VL, varying with time in circuit 1200.

DESCRIPTION

Figure 1:
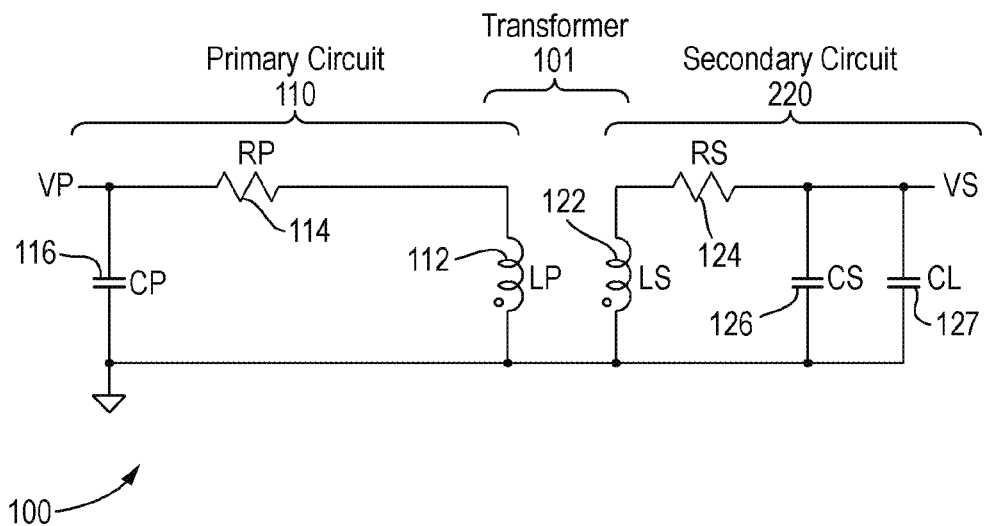
FIG. 1 is a circuit schematic of a typical circuit 100 for charging a capacitor.

FIG. 1 is a circuit schematic of a typical circuit 100 for charging a capacitor. The circuit comprises an air-cored transformer 101 having a primary winding and a secondary winding. A primary circuit 110 is connected to the primary winding and comprises a voltage source VP and a Ground connection either side of the winding. The inductance 112, LP, capacitance 116, CP and resistance 114, RP of the primary winding are illustrated separately within the primary circuit 110.

A secondary circuit 120 is connected to the secondary winding and shows an output voltage VS and a Ground connection either side of the secondary winding. The inductance 122, LS, capacitance 126, CS and resistance 124, RS of the secondary winding are illustrated separately within the secondary circuit 120. The secondary circuit 120 further comprises a load capacitor 127, CL.

The circuit 100 illustrated in FIG. 1 uses conventional air-cored Tesla Coils with a precise geometric construction to achieve the desired coupling coefficient between the primary and secondary windings or coils. The corresponding primary and secondary circuits are then designed to minimise any additional inductance. The primary winding typically comprises a single turn and is driven from a high voltage capacitor discharged in the primary circuit by a spark gap. Such air-cored Tesla Coils require a driver circuit that is capable of delivering high primary voltage and high peak currents, and minimal inductance.

Figure 2:
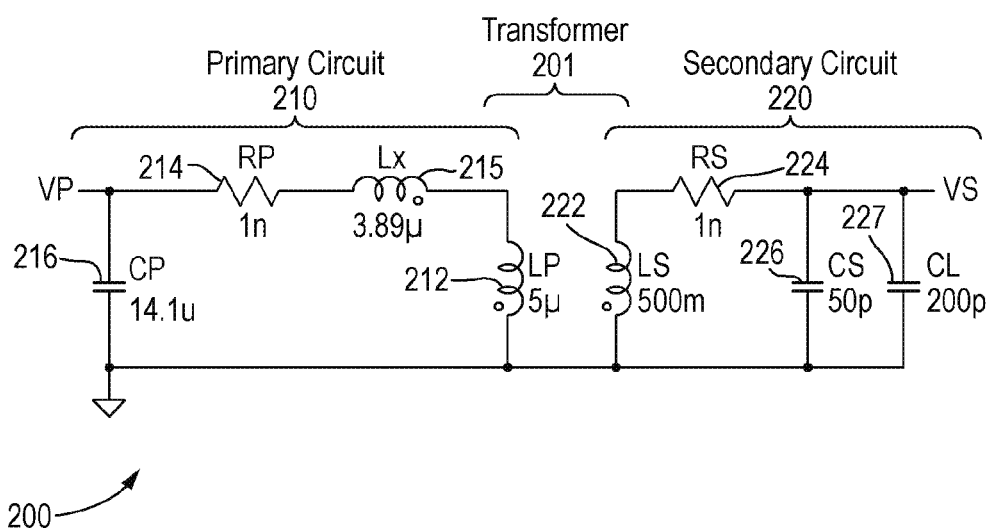
FIG. 2 is a circuit schematic of a circuit 200 illustrating an example of an apparatus for pulse charging a capacitor as described herein.

FIG. 2 is a circuit schematic of a circuit 200 illustrating an example of an apparatus for pulse charging a capacitor as described herein. Possible values for each of the components shown are given in FIG. 2. These figures are used in the subsequent calculations and charts, but are purely for example and should in no way be construed as restrictive or limiting of the present application. It should also be noted that FIG. 2 illustrates negligible resistance in the circuits whereas more realistic values might be RP of 80 mΩ (milli-Ohms) and RS of 4 kΩ (kilo-Ohms).

The circuit 200 comprises a ferrous cored transformer 201 having a primary winding and a secondary winding. A primary circuit 210 is connected to the primary winding and comprises a voltage source VP and a Ground connection either side of the winding. The inductance 212, LP, capacitance 216, CP and resistance 214, RP of the primary winding are illustrated separately within the primary circuit 210.

A secondary circuit 220 is connected to the secondary winding and shows an output voltage VS and a Ground connection either side of the secondary winding. The inductance 222, LS, capacitance 226, CS and resistance 224, RS of the secondary winding are illustrated separately within the secondary circuit 220. The secondary circuit 220 further comprises a load capacitor 227, CL.

The apparatus shown in FIG. 2 comprises an additional inductive component 215, Lx, arranged in series with the primary winding. The inductive component 215 is uncoupled from the transformer 201 and the secondary circuit 220.

Accordingly, FIG. 2 illustrates a dual resonant transformer for pulse charging of a capacitor. The additional uncoupled inductance 215, Lx, is implemented in the primary circuit 210 such that the coupling coefficient between the primary circuit 210 and the secondary circuit 220 has the desired value. As explained above, the desired value for the coupling coefficient is 0.6 as this gives substantially complete energy transfer on the second voltage peak, and this is most sited to capacitor charging.

This makes the coupling coefficient between the primary and secondary windings of the transformer less critical. As such, a ferrous cored transformer can be used in a dual resonant transformer for pulse charging of a capacitor. A ferrous cored transformer typically has a coupling coefficient between the primary and secondary windings in the region of 0.7 to 0.8. The addition of the uncoupled inductance allows the coupling coefficient between the primary and secondary circuits to be reduced to a desired value, such as the optimum value for an implementation such as the pulse charging of a capacitor.

It should be noted that a similar effect can be achieved by placing the additional uncoupled inductance Lx in the secondary circuit in series with the secondary winding and the load capacitance.

The following calculations illustrate a design process for determining the value of the uncoupled inductance Lx. A hypothetical transformer having the following parameters is used.

$LP = 5 \cdot 10^{-6}$ H Primary inductance $LS = 500 \cdot 10^{-3}$ H Secondary coil inductance $kT = 0.8$ Coupling coefficient between the primary and secondary windings $M = kT \cdot \sqrt{LP \cdot LS}$ Mutual inductance between the primary and secondary windings $M = 1.265 \times 10^{-3}$ H The load capacitance and charging voltage are generally fixed parameters of the system design. The total capacitance is the sum of the load capacitance and the secondary winding capacitance. From this, the natural resonant frequency of the secondary circuit can then be determined.

$CS := 50 \cdot 10^{-12}$      Secondary coil capacitance $CL := 200 \cdot 10^{-12}$      Load capacitance $VL := 300 \cdot 10^{3}$      Load voltage $fS := \dfrac{1}{2 \cdot \pi \cdot \sqrt{LS \cdot (CL + CS)}}$      Secondary circuit resonant frequency $fS = 14.235 \times 10^{3}$ Hz The coupling coefficient between the transformer windings is 0.8, and the required coupling coefficient between the circuits is 0.6. Therefore uncoupled inductance can be added into the primary circuit to bring the coupling down to the desired value.

$kC := 0.6$      Required coupling between primary and secondary circuits $Lx := \dfrac{1}{LS} \cdot \left(\dfrac{M}{kC}\right)^{2} - LP$      Required uncoupled primary inductance $Lx = 3.889 \times 10^{-6}$ H The required primary capacitance can now be determined as follows.

$CP := (CL + CS) \cdot \dfrac{LS}{LP + Lx}$      Primary capacitance $CP = 14.063 \times 10^{-6}$ F The above tuning can be illustrated by making the resistance negligible, as illustrated in FIG. 2 and simulating the transient response of the circuit.

Figure 3:
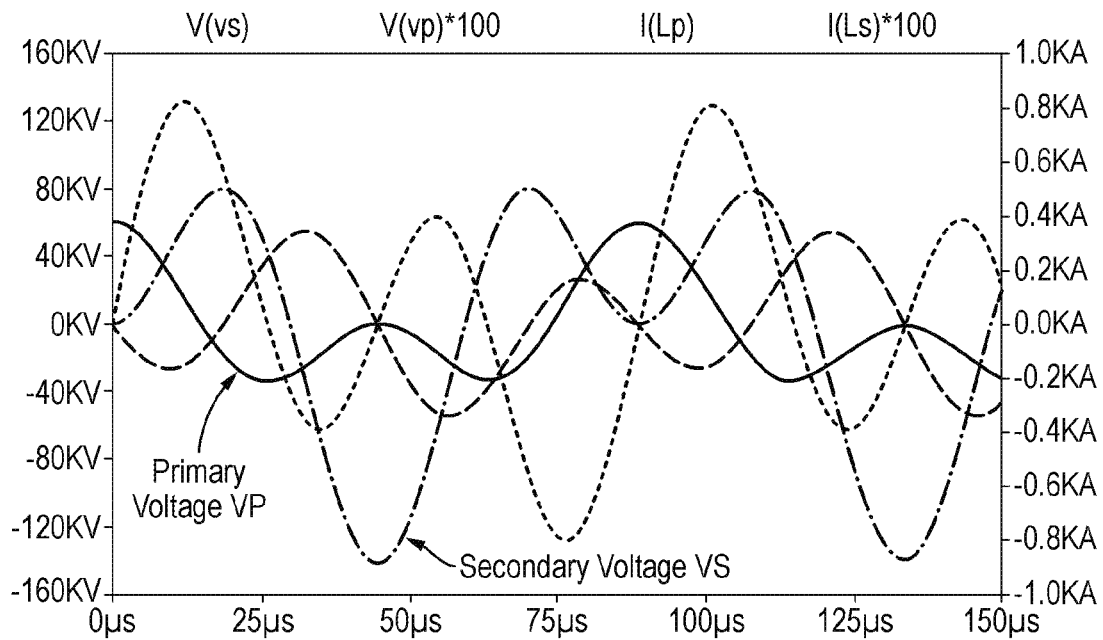
FIG. 3 is a graph illustrating the voltage and current at various points of the circuit 200 of FIG. 2 when in simulated operation.

FIG. 3 is a graph of primary illustrating the voltage and current at various points of the circuit 200 of FIG. 2 when in simulated operation. The simulated operation illustrated in FIG. 3 has negligible resistance. FIG. 3 shows traces of primary voltage, VP, secondary voltage, VS, primary current, I(LP), and secondary current I(LS). Note that the primary voltage and secondary current have been scaled up by a factor of 100 for clarity of comparison. The initial conditions are zero current in the primary and secondary circuits, zero voltage at the output voltage, VS, and 600 Volts at the input VP.

The graph shows that at approximately 44 µs (microseconds) everything but the secondary voltage VS is zero. The transformer is thus tuned for complete energy transfer on the second resonant peak of the secondary voltage waveform. In this simulation, in the absence of resistance, 100% of the energy is transferred from the primary winding to the secondary winding. Of course, in practical implementations the energy transfer is limited by resistive losses.

The efficiency of the transfer depends on the Q-factor of each of the primary and secondary circuits. In the primary circuit, there are losses in the capacitor, the switch, the wiring, and the winding of the primary winding. In the secondary circuit losses are dominated by the winding of the secondary winding, but there are also some losses in the load capacitor. Optimum implementation would maximise the Q-factor achievable in the space for both circuits.

Using the numbers given above in FIG. 2, the Q-factor for each circuit can be calculated as follows:

$RP := 80 \cdot 10^{-3}$      Primary circuit resistance $QP := \dfrac{\sqrt{\dfrac{LP + Lx}{CP}}}{RP}$      Primary circuit quality factor $QP = 9.938$ $RS := 4000$      Secondary circuit resistance $QS := \dfrac{\sqrt{\dfrac{LS}{CS + CL}}}{RS}$      Secondary circuit quality factor $QS = 11.18$ The damping effect of resistance on the primary and secondary circuits prevents the primary voltage form returning to zero, which means that in addition to resistive losses, there will be a small amount of remnant energy not transferred to the load.

Figure 4:
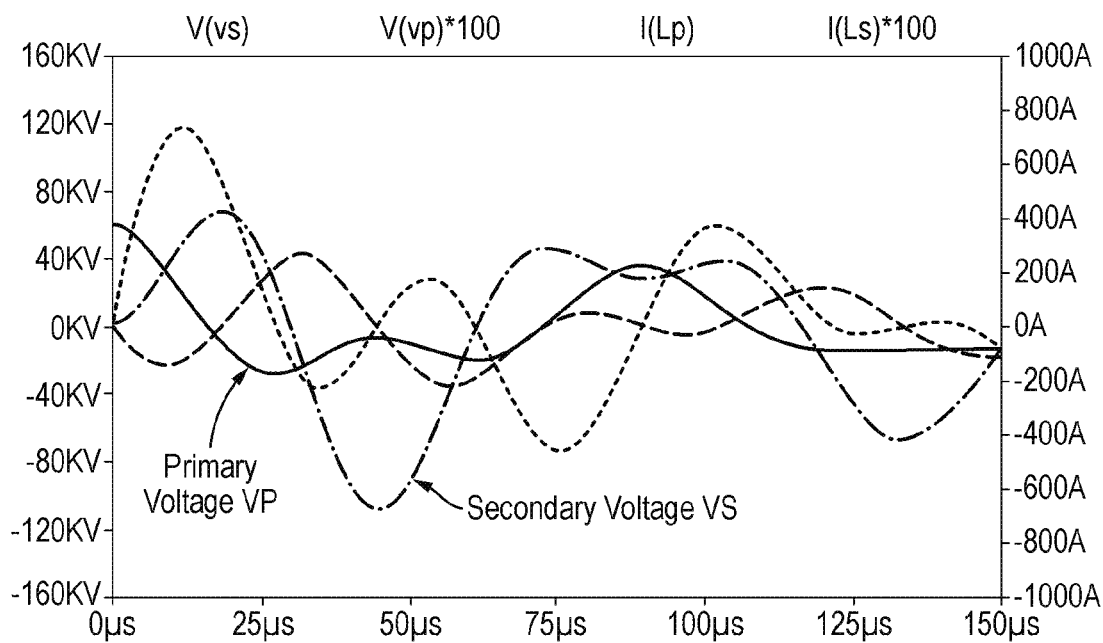
FIG. 4 is a simulation graph corresponding to a modified version of the circuit 200, with the resistance values RP and RS set to 80 mΩ (milli-Ohms) and 4 kΩ (kilo-Ohms) respectively.

FIG. 4 is a simulation graph corresponding to a circuit similar to that of FIG. 2, but with the resistance values RP and RS set to 80 mΩ (milli-Ohms) and 4 kΩ (kilo-Ohms) respectively. In the graph of FIG. 3, without resistance or damping, the secondary voltage reached −141.5 kV. The graph of FIG. 4 shows that with damping the secondary voltage has a negative peak of only −107.5 kV. The Q-factors of QP and QS at around a value of 10 are lower than is chosen in practice, where Q=50 or more is acceptable.

The circuit of FIG. 2 with resistance values RP and RS set to 80 mΩ (milli-Ohms) and 4 kΩ (kilo-Ohms) is an example of an apparatus for pulse charging of a load capacitor. The use of a ferrous cored transformer with a coupling coefficient greater than 0.6 allows a lower primary voltage to be used, and requires lower peak currents. Accordingly, a capacitor charging apparatus according to the present application can be powered by a semi-conductor based driver. This reduces system complexity, volume, and cost.

It should be noted that the uncoupled inductance is an inductor that is electrically connected to either the primary or secondary winding of the transformer. The uncoupled inductance is not magnetically coupled to the transformer windings. The uncoupled inductance may have a coupling coefficient with the primary winding of around zero. The uncoupled inductance may have a coupling coefficient with the secondary winding of around zero.

Figure 5:
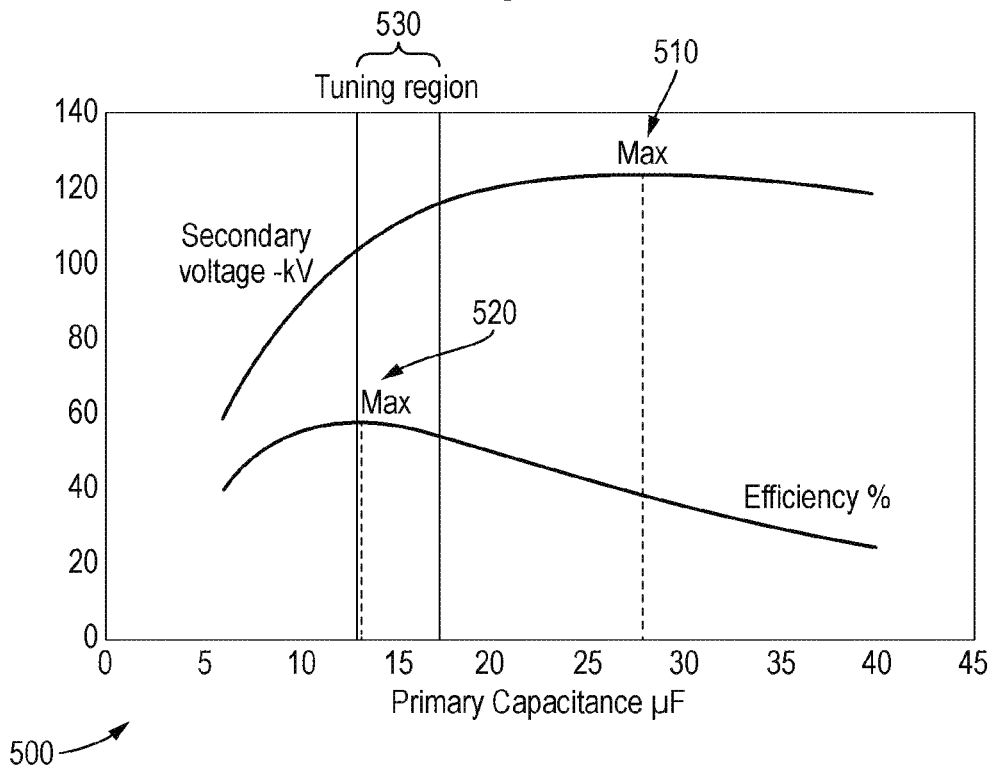
FIG. 5 is a graph illustrating the effect of varying the primary capacitance on secondary voltage and efficiency.

FIG. 5 is a graph 500 illustrating the effect of varying the primary capacitance on secondary voltage and efficiency. The secondary voltage can be increased a little by increasing the primary capacitance, at the expense of reduced efficiency. The voltage increases at a faster rate than the efficiency falls so unless efficiency is the most critical parameter for a given implementation, it is generally worth increasing the capacitance by 10-20% to maximise the performance of the system. FIG. 5 illustrates the maximum 510 secondary voltage, the maximum 520 efficiency, and the suggested tuning region 530.

There is provided herein an apparatus for pulse charging of a load capacitor, the apparatus comprising: a ferrous cored transformer having a primary winding and a secondary winding; a primary circuit connected to the primary winding; a secondary circuit connected to the secondary winding, the secondary circuit comprising the load capacitor; and an uncoupled inductance in the primary circuit or the secondary circuit, the uncoupled inductance reducing the coupling coefficient between the primary circuit and the secondary circuit.

The ferrous cored transformer may be a ferrite cored transformer.

The uncoupled inductance may be in series with the primary winding or the secondary winding.

The coupling coefficient between the primary circuit and the secondary circuit may be such that the load capacitor charges on the second voltage peak. In an alternative arrangement the coupling coefficient between the primary circuit and the secondary circuit may be such that the load capacitor charges on the third voltage peak. In an alternative arrangement the coupling coefficient between the primary circuit and the secondary circuit may be such that the load capacitor charges on the fourth voltage peak. In an alternative arrangement the coupling coefficient between the primary circuit and the secondary circuit may be such that the load capacitor charges on the $N^{th}$ voltage peak.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

The uncoupled inductance may be provided by a variable inductor component.

Figure 6:
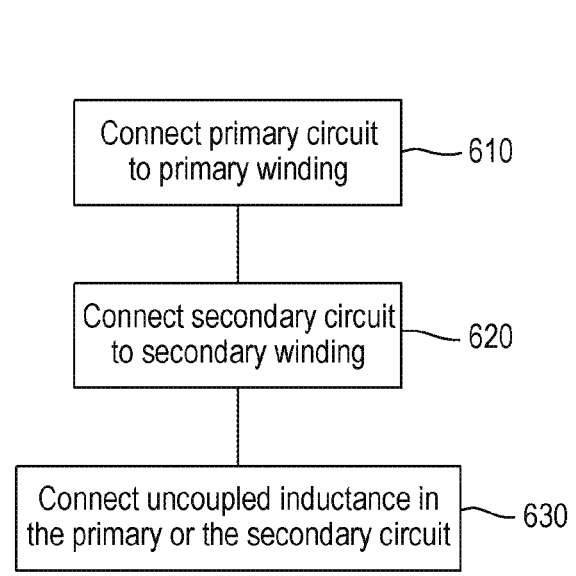
FIG. 6 is a process flow chart illustrating a method 600 of pulse charging of a capacitor.

FIG. 6 is a process flow chart illustrating a method 600 of pulse charging of a load capacitor. The method comprising: connecting 610 a primary circuit to a primary winding of a ferrous cored transformer; connecting 620 a secondary circuit to a secondary winding of a ferrous cored transformer, the secondary circuit comprising the load capacitor; and connecting 630 an uncoupled inductance in the primary circuit or the secondary circuit, the uncoupled inductance reducing the coupling coefficient between the primary circuit and the secondary circuit.

The ferrous cored transformer may be a ferrite cored transformer.

The uncoupled inductance may be in series with the primary winding or the secondary winding.

The coupling coefficient between the primary circuit and the secondary circuit may be such that the load capacitor charges on the second voltage peak, or the $N^{th}$ voltage peak.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

The uncoupled inductance may be provided by a variable inductor component.

Figure 7:
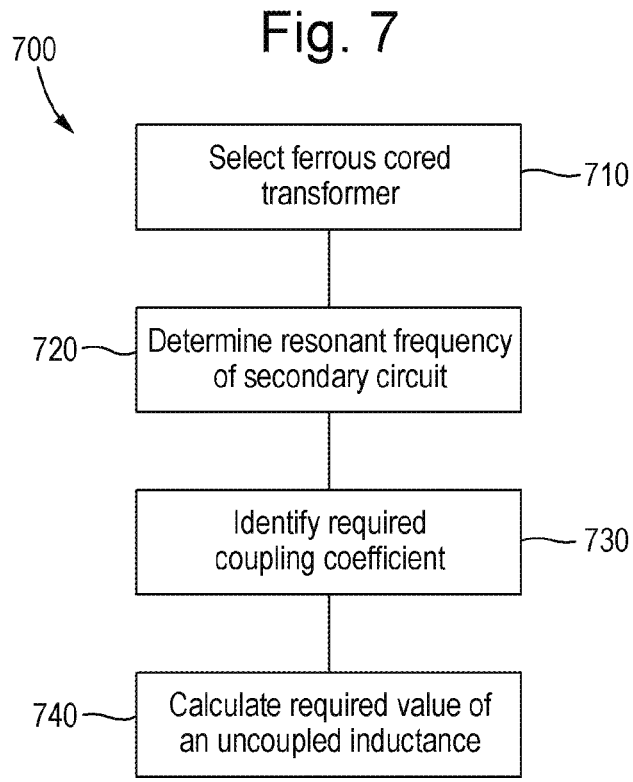
FIG. 7 is a process flow chart illustrating a method 700 of designing a circuit for pulse charging of a capacitor.

FIG. 7 is a process flow chart illustrating a method 700 of designing a circuit for pulse charging of a load capacitor, the method comprising: selecting 710 a ferrous cored transformer, and calculating the mutual inductance between the primary and secondary windings; determining 720 the secondary circuit resonant frequency; and identifying 730 a required coupling coefficient for the primary and secondary circuits, and calculating 740 a required value of an uncoupled inductance such that the primary and secondary circuits are coupled by the required coupling coefficient.

Calculating the mutual inductance between the primary and secondary windings may comprise identifying the primary winding inductance, the secondary winding inductance, the coupling coefficient between the primary and secondary windings, and calculating therefrom the mutual inductance between the primary and secondary windings.

Determining the secondary circuit resonant frequency may comprise determining the secondary winding capacitance, secondary winding inductance, and load capacitance, and calculating therefrom the secondary circuit resonant frequency.

The coupling coefficient between the primary circuit and the secondary circuit may be less than 0.7. The coupling coefficient between the primary circuit and the secondary circuit may be more preferably around 0.6. The coupling coefficient between the primary circuit and the secondary circuit may be more preferably 0.6.

Some additional examples will now be described showing the principles described herein with reference to circuits with different component values.

Figure 8:
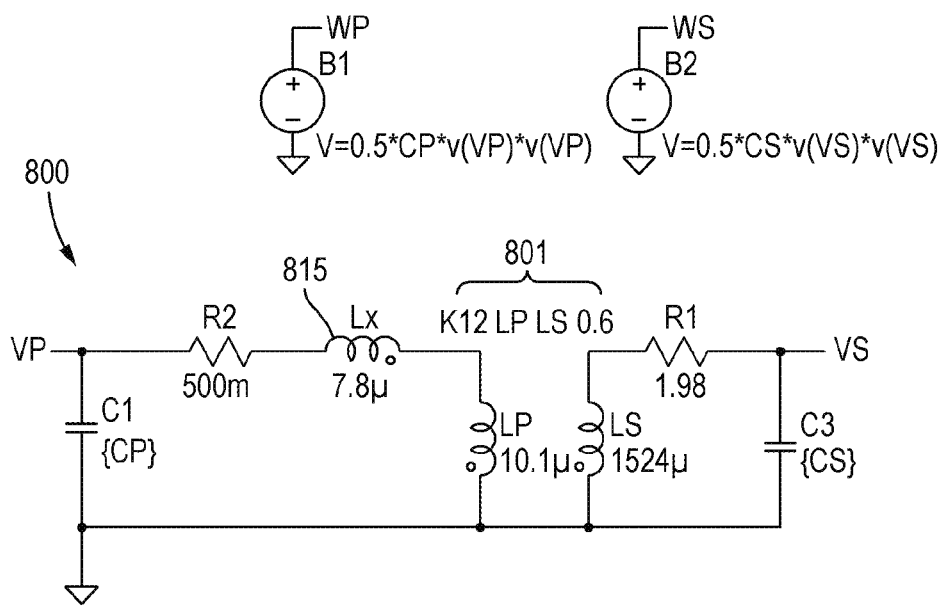
FIG. 8 illustrates an alternative example circuit 800.

FIG. 8 illustrates an alternative example circuit 800. In circuit 800, the primary capacitance, CP, has a value 127 nF (nano-Farads), the secondary capacitance, CS, has a value 1500 pF (pico-Farads). The initial voltage at VP is 50 Volts. A transformer 801 has a ferrite core and a coupling coefficient of k=0.8 between the primary and secondary windings. The primary winding has an inductance of 10.1 µH (micro Henrys) and the secondary winding has an inductance of 15.24 µH (micro Henrys). The value of a tuning inductor 815 is calculated as described herein. A tuning inductor, Lx, 815 with an inductance of 7.8 µH (micro Henrys) is connected in series with the primary winding of the transformer 801. The tuning inductor, Lx, 815 renders the coupling coefficient between the primary and secondary circuit different to the coupling coefficient between the primary and secondary windings. In this example, the coupling coefficient between the primary and secondary circuit is k=0.6.

Figure 9A:
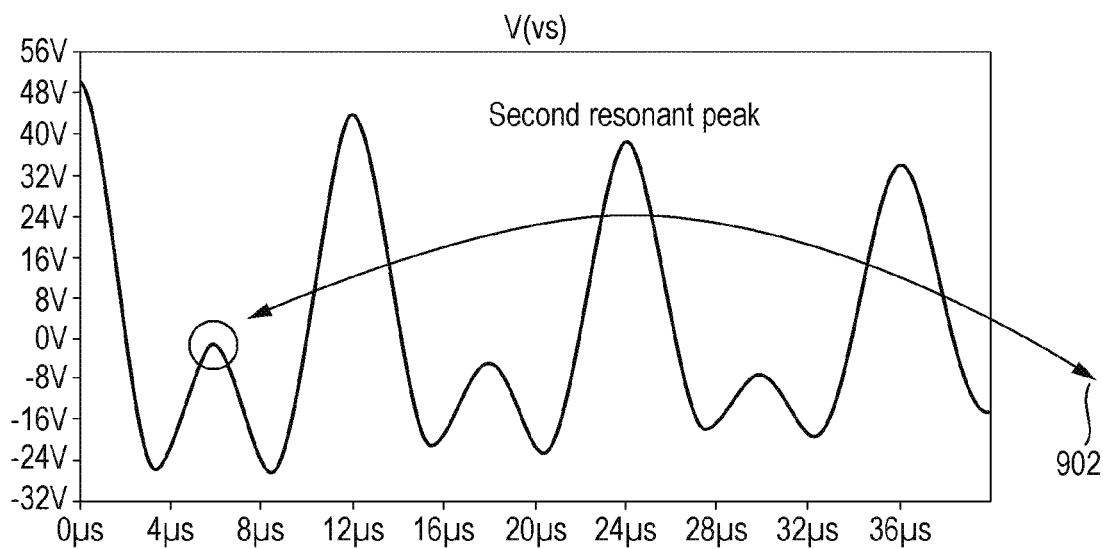
FIGS. 9A and 9B are graphs showing the input capacitor voltage VP, and output capacitor voltage VS, respectively, varying with time in circuit 800.
Figure 9B:
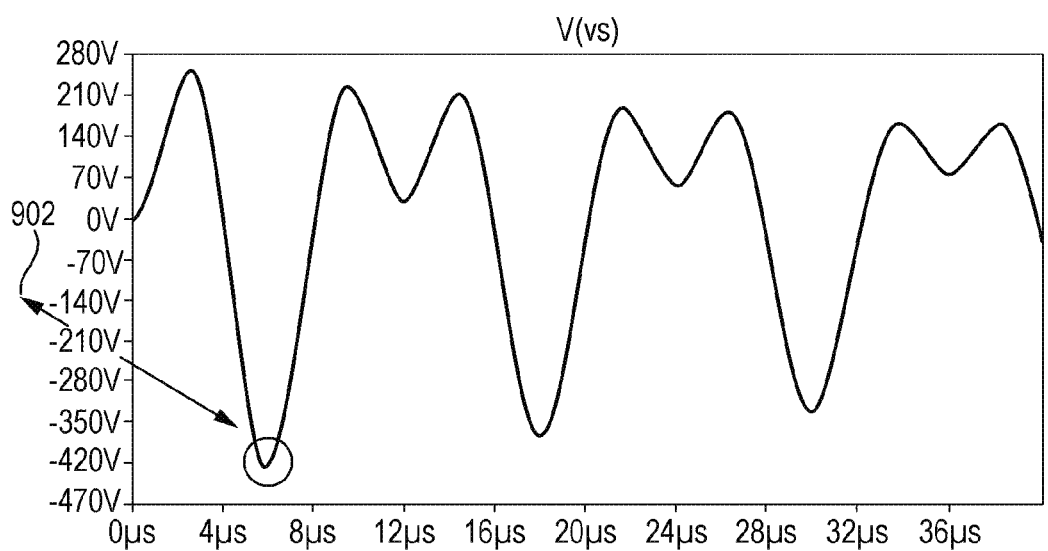

FIG. 9A is a graph showing the input capacitor voltage VP, varying with time. The input capacitor voltage, VP, has a value of 50 Volts at t=0. FIG. 9B is a graph showing the output capacitor voltage VS, varying with time. The output capacitor voltage VS has an initial condition of 0 Volts at t=0. The second resonant peak occurs at t=6 µs (microseconds). At t=6 µs the input voltage is zero when the output voltage is minimum, hence it can be determined that there has been an efficient energy transfer to the output capacitor. In this example, substantially all available energy has been transferred to the output capacitor.

Figure 10:
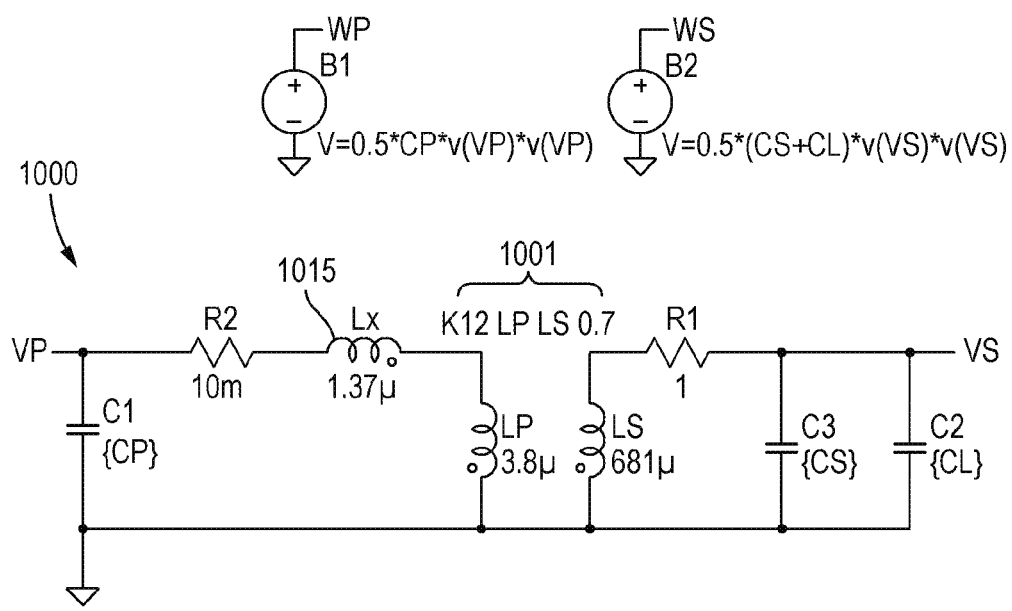
FIG. 10 illustrates an alternative example circuit 1000.

FIG. 10 illustrates an alternative example circuit 1000. In circuit 1000, the primary capacitance, CP, has a value 124.8 µF (micro-Farads), the secondary capacitance, CS, has a value 50 pF (pico-Farads), and the load capacitance, CL, has a value 800 pF (pico-Farads). The initial voltage at VP is 805 Volts. A transformer 1001 has a ferrite core and a coupling coefficient of k=0.7 between the primary and secondary windings. The primary winding has an inductance of 3.8 μH (micro Henrys) and the secondary winding has an inductance of 681 mH (milli Henrys). The value of a tuning inductor 1015 is calculated as described herein. A tuning inductor, Lx, 1015 with an inductance of 1.37 μH (micro Henrys) is connected in series with the primary winding of the transformer 1001. The tuning inductor, Lx, 1015 renders the coupling coefficient between the primary and secondary circuit different to the coupling coefficient between the primary and secondary windings.

Figure 11:
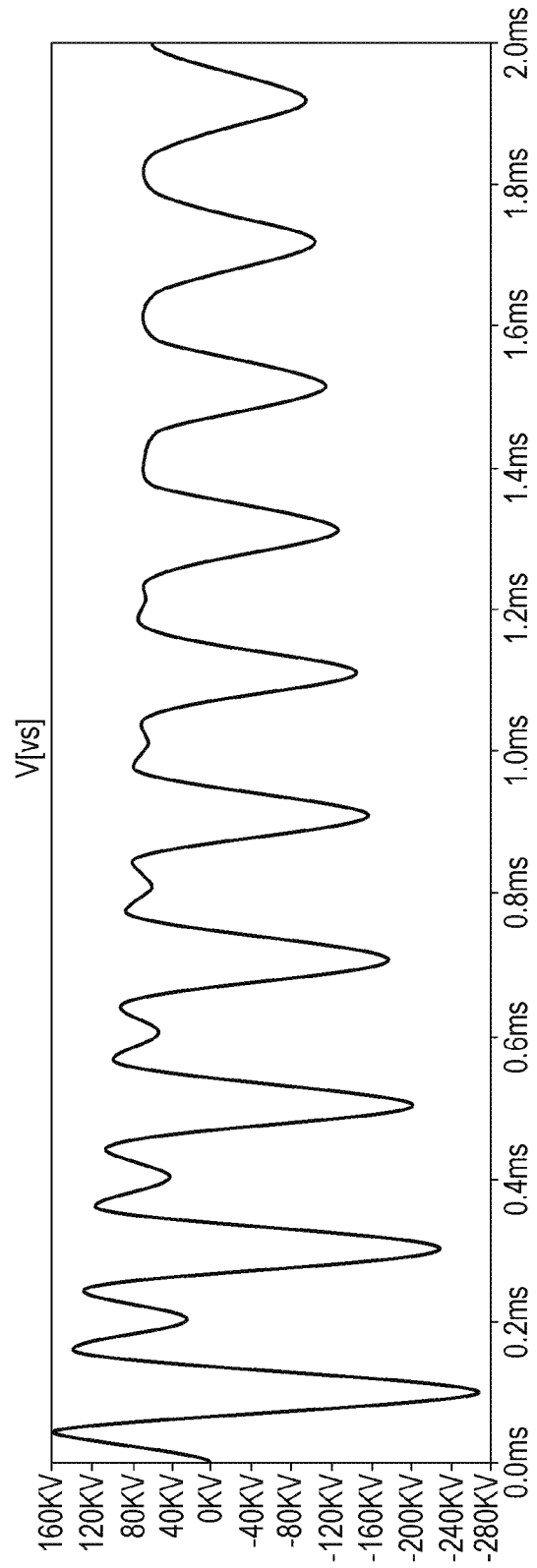
FIG. 11 is a graph showing the voltage at the load capacitor, VL, varying with time in circuit 1000.

FIG. 11 is a graph showing the voltage at the load capacitor, VL, varying with time from the initial voltage VP=805 Volts. The circuit is resonant at 6.25 kHz (kilo Hertz). The second resonant peak occurs at around −270 kV (kilo Volts), this would have a greater magnitude but is reduced due to resistive damping in the circuit 1000.

Figure 12:
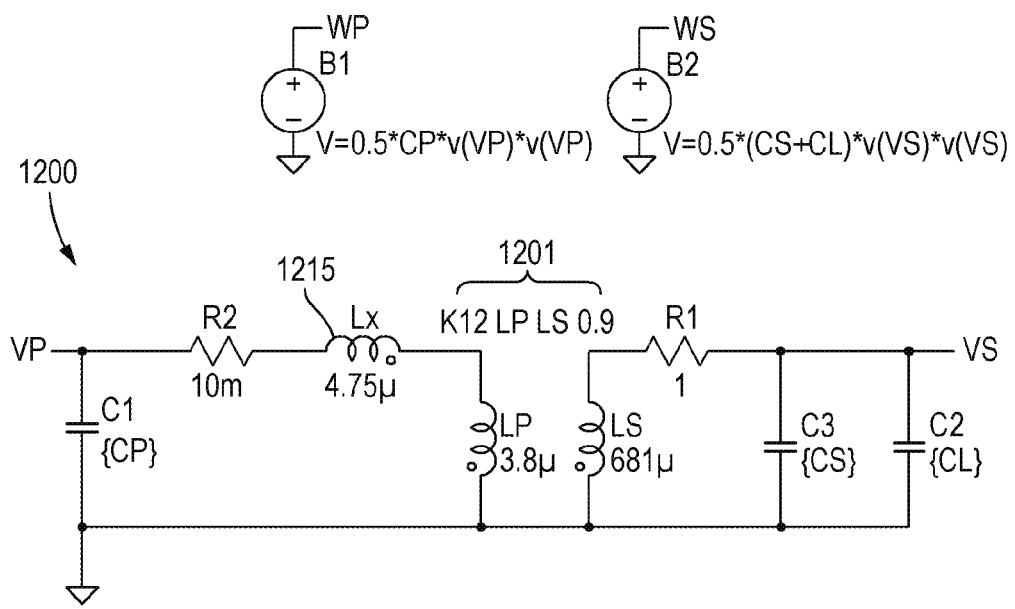
FIG. 12 illustrates an alternative example circuit 1200.

FIG. 12 illustrates an alternative example circuit 1200. In circuit 1200, the primary capacitance, CP, has a value 75.5 μF (micro-Farads), the secondary capacitance, CS, has a value 50 pF (pico-Farads), and the load capacitance, CL, has a value 900 pF (pico-Farads). The initial voltage at VP is 1035 Volts. A transformer 1201 has a ferrite core and a coupling coefficient of k=0.9 between the primary and secondary windings. The primary winding has an inductance of 3.8 μH (micro Henrys) and the secondary inductance has an inductance of 681 mH (milli Henrys). The value of a tuning inductor 1215 is calculated as described herein. A tuning inductor, Lx, 1215 with an inductance of 4.75 μH (micro Henrys) is connected in series with the primary winding of the transformer 1201. The tuning inductor, Lx, 1215 renders the coupling coefficient between the primary and secondary circuit different to the coupling coefficient between the primary and secondary windings.

FIG. 13 is a graph showing the voltage at the load capacitor, VL, varying with time from the initial voltage VP=1035 Volts. The circuit is resonant at 6.25 kHz (kilo Hertz). The second resonant peak occurs at around −280 kV (kilo Volts), the magnitude of this minimum is reduced due to resistive damping in the circuit 1200.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the scope of invention.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An apparatus for pulse charging of a load capacitor, the apparatus comprising:
   a ferrous cored transformer having a primary winding, a secondary winding, and a coupling coefficient between the primary winding and the secondary winding;
   a primary circuit connected to the primary winding, the primary circuit configured to carry a first voltage;
   a secondary circuit connected to the secondary winding, the secondary circuit comprising the load capacitor, the secondary circuit configured to carry a second voltage having a first resonant peak while the first voltage is non-zero and a second resonant peak while the first voltage is zero; and
   an uncoupled inductance in the primary circuit, the uncoupled inductance being magnetically uncoupled from the primary winding and the secondary winding and having a value wherein a coupling coefficient between the primary circuit and the secondary circuit is 0.6 and the coupling coefficient between the primary winding and the secondary winding is greater than 0.6 such that the load capacitor charges on the second resonant peak of the secondary voltage while the first voltage is zero.

2. The apparatus of claim 1, wherein the uncoupled inductance is in series with the primary winding.

3. The apparatus of claim 1, wherein the uncoupled inductance is provided by a variable inductor component.

4. A method of pulse charging of a load capacitor, the method comprising:
   connecting a primary circuit to a primary winding of a ferrous cored transformer, the primary circuit configured to carry a first voltage;
   connecting a secondary circuit to a secondary winding of a ferrous cored transformer, the secondary circuit comprising the load capacitor, the secondary circuit configured to carry a second voltage having a first resonant peak while the first voltage is non-zero and a second resonant peak while the first voltage is zero; and
   connecting an uncoupled inductance in the primary circuit, the uncoupled inductance being magnetically uncoupled from the primary winding and the secondary winding and having a value wherein a coupling coefficient between the primary circuit and the secondary circuit is 0.6 and a coupling coefficient between the primary winding and the secondary winding is greater than 0.6 such that the load capacitor charges on the second resonant peak of the secondary voltage while the first voltage is zero.

5. The method of claim 4, wherein the uncoupled inductance is in series with the primary winding.

6. The method of claim 4, wherein the uncoupled inductance is provided by a variable inductor component.

7. A method of designing a circuit for pulse charging of a load capacitor, the method comprising:
   selecting a ferrous cored transformer having a primary winding, a secondary winding, and a coupling coefficient between the primary winding and the secondary winding, and calculating the mutual inductance between the primary and secondary windings;
   determining a secondary circuit resonant frequency; and
   identifying a required coupling coefficient for a primary circuit connected to the primary winding and a secondary circuit connected to the secondary winding, the primary circuit configured to carry a first voltage, the secondary circuit comprising the load capacitor and configured to carry a second voltage having a first resonant peak while the first voltage is non-zero and a second resonant peak while the first voltage is zero, and calculating a value of an uncoupled inductance such that the primary and secondary circuits are coupled by the coupling coefficient, wherein the uncoupled inductance is magnetically uncoupled from the primary winding and the secondary winding and has a value wherein the coupling coefficient between the primary circuit and the secondary circuit is 0.6 and the coupling coefficient between the primary winding and the secondary winding is greater than 0.6 such that the load capacitor charges on the second resonant peak of the secondary voltage while the first voltage is zero.

8. The method of claim 7, wherein calculating the mutual inductance between the primary and secondary windings comprises: identifying the primary inductance, the secondary winding inductance, the coupling coefficient between the primary and secondary windings, and calculating therefrom the mutual inductance between the primary and secondary windings.

9. The method of claim 7, wherein determining the secondary circuit resonant frequency comprises: determining the secondary winding capacitance, load capacitance and load voltage, and calculating therefrom the secondary circuit resonant frequency.

10. The method of claim 7, comprising the uncoupled inductance with a variable inductor component.

11. The method of claim 7, wherein the uncoupled inductance is in series with the primary winding.

\* \* \* \* \*